(12) United States Patent
Tsang

(10) Patent No.: US 6,909,633 B2
(45) Date of Patent: Jun. 21, 2005

(54) MRAM ARCHITECTURE WITH A FLUX CLOSED DATA STORAGE LAYER

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/688,664

(22) Filed: Oct. 16, 2003

(65) Prior Publication Data
US 2004/0130929 A1 Jul. 8, 2004

Related U.S. Application Data

(60) Provisional application No. 60/448,876, filed on Feb. 24, 2003, and provisional application No. 60/431,742, filed on Dec. 9, 2002.

(51) Int. Cl.$^7$ .............................................. G11C 11/15
(52) U.S. Cl. .................. 365/173; 365/171; 365/158; 365/225.5; 365/55; 365/66; 365/87
(58) Field of Search ................................ 365/173, 171, 365/158, 225.5, 55, 66, 87

(56) References Cited

U.S. PATENT DOCUMENTS

| | | | |
|---|---|---|---|
| 5,659,499 A | 8/1997 | Chen et al. | 365/158 |
| 5,841,692 A | 11/1998 | Gallagher et al. | 365/173 |
| 5,940,319 A | 8/1999 | Durlam et al. | 365/171 |
| 6,153,443 A | 11/2000 | Durlam et al. | 438/3 |
| 6,166,948 A | 12/2000 | Parkin et al. | 365/173 |
| 6,211,090 B1 | 4/2001 | Durlam et al. | 438/692 |
| 6,269,018 B1 * | 7/2001 | Monsma et al. | 365/145 |
| 6,351,409 B1 * | 2/2002 | Rizzo et al. | 365/158 |
| 6,724,651 B2 * | 4/2004 | Hirai | 365/158 |
| 6,740,947 B1 * | 5/2004 | Bhattacharyya et al. | 257/421 |
| 2002/0127743 A1 | 9/2002 | Nickel et al. | 438/3 |
| 2004/0100818 A1 * | 5/2004 | Yoda et al. | 365/173 |
| 2004/0109339 A1 * | 6/2004 | Tsang | 365/98 |
| 2004/0150015 A1 * | 8/2004 | Tsang | 257/293 |
| 2004/0150017 A1 * | 8/2004 | Tsang | 257/295 |
| 2004/0165424 A1 * | 8/2004 | Tsang | 365/171 |
| 2004/0179393 A1 * | 9/2004 | Yoda et al. | 365/158 |
| 2004/0179395 A1 * | 9/2004 | Tsang | 365/171 |
| 2004/0188734 A1 * | 9/2004 | Tsang | 257/295 |
| 2004/0191928 A1 * | 9/2004 | Shi | 438/3 |

FOREIGN PATENT DOCUMENTS

JP 02003257174 A * 9/2003 ........... G11C/11/15

* cited by examiner

Primary Examiner—Viet Q. Nguyen
(74) Attorney, Agent, or Firm—Sawyer Law Group LLP

(57) ABSTRACT

A method and system for providing and using a magnetic memory are disclosed. The method and system include providing a plurality of magnetic memory cells and providing at least one magnetic write line coupled with the plurality of magnetic memory cells. Each of the magnetic memory cells includes a magnetic element having a data storage layer. The data storage layer stores data magnetically. The magnetic write line(s) are magnetostatically coupled with at least the data storage layer of the magnetic element of the corresponding magnetic memory cells. Consequently, flux closure is substantially achieved for the data storage layer of each of the plurality of magnetic memory cells.

25 Claims, 7 Drawing Sheets

MRAM ARCHITECTURE WITH A FLUX CLOSED DATA STORAGE LAYER

CROSS-REFERENCE TO RELATED APPLICATIONS

This application is claiming under 35 USC 119(e) the benefit of provisional patent application Ser. No. 60/448,876 filed on Feb. 24, 2003.

The present application is related to co-pending U.S. patent application Ser. No. 10/459,133 entitled "MRAM MEMORIES UTILIZING MAGNETIC WRITE LINES", filed on Jun. 11, 2003, which claims benefit of provisional application Ser. No. 60/431,742 filed on Dec. 9, 2002, and assigned to the assignee of the present application.

FIELD OF THE INVENTION

The present invention pertains to magnetic memories, and more particularly to a method and system for providing a magnetic random access memory (MRAM) that is preferably high density, nonvolatile and that incorporates write-lines having improved writing efficiencies, ease of manufacturing, and better stability.

BACKGROUND OF THE INVENTION

Recently, a renewed interest in thin-film magnetic random access memories (MRAM) has been sparked by the potential application of MRAM to both nonvolatile and volatile memories. FIG. 1 depicts a portion of a conventional MRAM 1. The conventional MRAM includes conventional orthogonal conductor lines 10 and 12, conventional magnetic storage cell 11 and conventional transistor 13. The conventional MRAM 1 utilizes a conventional magnetic tunneling junction (MTJ) stack 11 as a memory cell. Use of a conventional MTJ stack 11 makes it possible to design an MRAM cell with high integration density, high speed, low read power, and soft error rate (SER) immunity. The conductive lines 10 and 12 are used for writing data into the magnetic storage device 11. The MTJ stack 11 is located on the intersection of and between 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 11 stack primarily includes the free layer 1103 with the changeable magnetic vector (not explicitly shown), the pinned layer 1101 with the fixed magnetic vector (not explicitly shown), and the insulator 1102 in between the two magnetic layers 1101 and 1103. The insulator 1102 typically has a thickness that is low enough to allow tunneling of charge carriers between the magnetic layers 1101 and 1103. Layer 1100 is usually a composite of seed layers and an anti-ferromagnetic layer that is strongly coupled to the pinned magnetic layer. Layer 1104 is a nonmagnetic capping layer, which protects the underlying layers 1100, 1101, 1102, and 1103.

Data is stored in the conventional MTJ stack 11 by applying a magnetic field to the conventional MTJ stack 11. The applied magnetic field has a direction chosen to move the changeable magnetic vector of the free layer 1103 to a selected orientation. During writing, the electrical current $I_1$ flowing in the conventional bit line 12 and $I_2$ flowing in the conventional word line 10 yield two magnetic fields on the free layer 1103. In response to the magnetic fields generated by the currents $I_1$ and $I_2$, the magnetic vector in free layer 1103 is oriented in a particular, stable direction. This direction depends on the direction and amplitude of $I_1$ and $I_2$ and the properties and shape of the free layer 1103. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

Furthermore, to be competitive with other types of memory, the density and capacity of an MRAM chip embodying technology such as the conventional MRAM 1 should be comparable with that of DRAM, FLASH or SRAM products. For state-of-the-art technology, the size of an MRAM cell is in the submicron range. The lateral size of the MTJ stack 11 is even smaller, in the deep submicron range. Moreover, as memory densities increase, the lateral size of the MTJ stack 11 is further reduced. The small size of the MTJ stack 11 leads to problems in the performance of the conventional MRAM 1.

As the lateral dimensions of the MRAM cell and MTJ stack 11 are reduced, the volume of each of the magnetic layers 1101 and 1103 in the conventional MTJ stack 11 is reduced. The reduction in volume of the magnetic layers 1101 and 1103 leads to the possibility of "super-paramagnetic" behavior. For a layer exhibiting super-paramagnetic behavior, thermal fluctuations can cause the magnetic moment of the layer to spontaneously rotate if the magnetic anisotropy of the layer is not sufficiently large. The magnetic anisotropy of a layer, or other magnetic entity, is proportional to its volume. Consequently, layers 1101 and 1103 are more likely to exhibit super-paramagnetic behavior for conventional MTJ stacks 11 having smaller lateral dimensions.

Conventional MTJ stacks 11 having smaller lateral dimensions may also have increased magnetic interactions between the magnetic layers 1101 and 1103. The stray magnetic fields at the edges of the MTJ cell are generated by the magnetic poles at the edges of the ferromagnetic layers 1101 and 1103 of the conventional MTJ stack 11. These stray magnetic fields increase in magnitude for smaller conventional MTJ stacks 11. Stray magnetic fields can lead to large magnetic interactions between the pinned layer 1101 and the free layer 1103 within a single MTJ storage cell. Due to magnetic interactions between the ferromagnetic layers 1101 and 1103 in a single conventional MTJ cell, the state of the MTJ cell in which the magnetic moments of the ferromagnetic layers 1101 and 1103 are antiparallel is more energetically stable than the state in which the moments of the layers 1101 and 1103 are parallel. This asymmetry in the stability of the conventional MTJ stack 111 leads to asymmetries in the magnetic switching between the parallel and antiparallel states of the MTJ cell. Consequently, it becomes difficult to operate the MTJ cell and, therefore, the conventional MRAM 1. The stray magnetic fields can also lead to magnetic interactions between the ferromagnetic layers 1101 and 1103 of one conventional MTJ stack 111 and the ferromagnetic layers (not shown) of neighboring MTJ storage cells. In this case, the magnetic switching field of a given MTJ cell depends on the magnetic state of its neighboring MTJ cells. Consequently, the margin of write operations of the memory array is reduced. Eventually, the conventional MRAM 1 becomes inoperable. Unless these magnetostatic interactions can be mitigated, the smallest size of the MTJ cells and thus the highest density of the MTJ MRAM are limited.

The magnetostatic fields emanating from the exchange-biased pinned layer 1101 can be greatly reduced by replacing the conventional pinned layer 1101 with a sandwich of two ferromagnetic films antiferromagnetically coupled to one another and separated by a thin antiferromagnetic coupling film. The antiferromagnetically coupled films together with the antiferromagnetic coupling film thus form a synthetic pinned layer. Such a system is described in U.S. Pat. No. 5,841,692. In the synthetic pinned layer, the magnetic moments of the two ferromagnetic films in the pinned layer are aligned antiparallel. Consequently, the net magnetic moment of the synthetic pinned layer is reduced compared to a pinned layer comprised of a single ferromagnetic layer. Because the strength of the magnetostatic field from a ferromagnetic layer is proportional to the net magnetic moment of the layer, the magnetostatic field from the synthetic pinned layer is less than that of a pinned layer comprised of a single ferromagnetic layer.

It is also possible to reduce the strength of the magnetostatic fields emanating from the edges of the free layer 1103 of the conventional MTJ 11 by forming a synthetic free layer from a sandwich of two antiferromagnetically coupled ferromagnetic films which are separated by an antiferromagnetic coupling film. However, the synthetic free layer may have several disadvantages. The antiferromagnetic coupling film is extremely thin. Consequently, the thermal stability of the antiferromagnetically coupled ferromagnetic films may not be adequate for the required wafer processing steps to which the MTJ materials will be subjected. The antiferromagnetic coupling may, therefore, be broken. In addition, the magnetic properties of the synthetic free layer may be inferior to that of the individual ferromagnetic films because of an incomplete antiferromagnetic coupling between the ferromagnetic films if the films. The antiferromagnetic coupling may be incomplete for several reasons, for example, the use of ferromagnetic films that are not extremely smooth. When fabricating a conventional MTJ stack 11, it is usually preferable to first deposit the metallic antiferromagnetic layer included in the layers 1100 and the pinned layer 1101 to which it is exchange-biased to achieve optimal exchange biasing. This order is preferred because metallic layers grown on top of the insulator 1102, which is usually formed from an amorphous layer of $Al_2O_3$, may be rougher than the layers formed beneath the insulator 1102. Typically metal layers do not "wet" oxide layers so that thin metal layers deposited on oxide layers are comprised of numerous islands of varying sizes and heights. Such metal layers are necessarily rough. Moreover, such layers will have a poor crystallographic texture. For these reasons, it is very difficult not only to prepare very thin ferromagnetic free layers 1103 with good magnetic properties but also antiferromagnetically coupled free layers with appropriate magnetic properties.

U.S. Pat. No. 6,166,948 discloses one conventional method for addressing this problem. The MTJ cell disclosed in the patent has a multilayer free layer including two ferromagnetic films that are magnetostatically coupled antiparallel to one another by their respective dipole fields. The magnetostatic, or dipolar, coupling of the two ferromagnetic films occurs across a nonferromagnetic spacer layer. The nonferromagnetic spacer layer is selected to prevent exchange coupling between the two ferromagnetic films. The magnetic moments of the two ferromagnetic films are antiparallel to each other so that the multilayer free layer has a reduced net magnetic moment. The reduced net magnetic moment of the multilayer free layer reduces the magnetostatic coupling between the multilayer free layer and the pinned layer in the MTJ cell. The reduced magnetic moment of the multilayer free layer also reduces the magnetostatic coupling between adjacent MTJ cells in the array. However, based on the principles disclosed in the patent, the two layers of ferromagnetic films have very different properties. For example, one film is very thick, has a low magnetization and close-to-zero coercivity. The other film is thin, has high magnetization and high coercivity. Under these conditions, the moment of the free layer of the MTJ device can be reduced by more than forty percent but still far from being cancelled completely. The interaction field between cells is still about sixty of that in a single ferromagnetic layer free layer case. Additionally, shape anisotropy may make it impossible to achieve close to zero coercivity with either of the two ferromagnetic layers. Consequently, this scheme is very difficult to implement.

Accordingly, what is needed is a magnetic memory in which the moment of the free layer of the MTJ can be completely cancelled or reduced, thereby reducing or eliminating magnetic interactions between magnetic layers within a cell and between adjacent cells. In addition, it would also be desirable for the MTJ cells to be protected against stray magnetic field and to have improved write efficiency. The present invention addresses such a need.

SUMMARY OF THE INVENTION

The present invention provides a method and system for providing and using a magnetic memory. The method and system comprise providing a plurality of magnetic memory cells and providing at least one magnetic write line coupled with the plurality of magnetic memory cells. Each of the plurality of magnetic memory cells includes a magnetic element having a data storage layer that stores data magnetically. The at least one magnetic write line is magnetostatically coupled with at least the data storage layer of the magnetic element of each of the plurality of magnetic memory cells. Consequently, flux closure is substantially achieved between the data storage layer of each of the plurality of magnetic memory cells.

According to the system and method disclosed herein, the present invention provides a magnetic memory in which magnetic interactions between magnetic layers within a cell and between adjacent cells are reduced or eliminated and in which protection against stray magnetic fields may be improved.

DETAILED DESCRIPTION OF THE INVENTION

Figure 1:
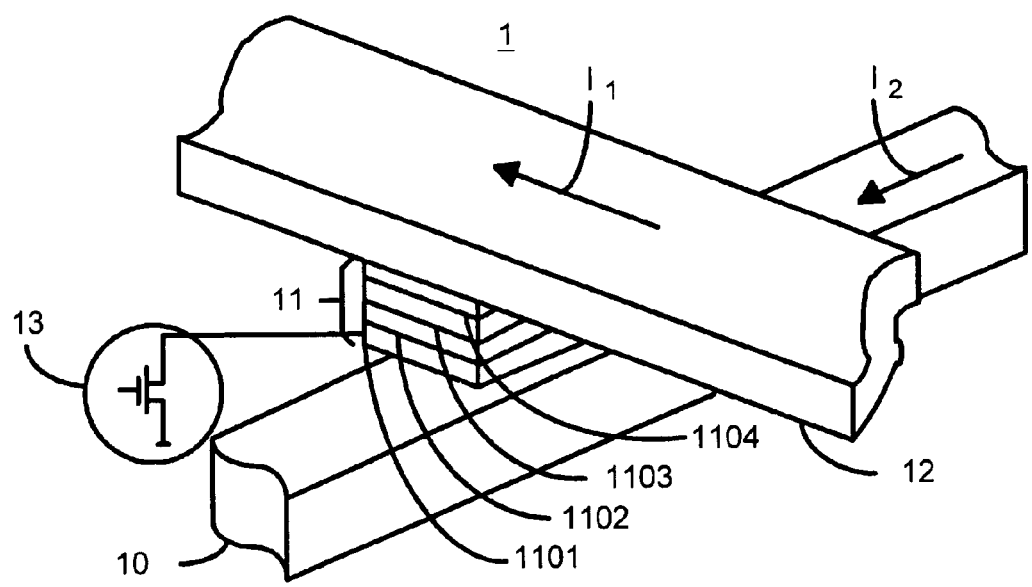
FIG. 1 is a three-dimensional view of a portion of a conventional magnetic memory including a MTJ cell, located at the intersection of a bit line and a word line.

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Co-pending U.S. patent application Ser. No. 10/459,133 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. In the above-identified co-pending application, the MRAM architecture utilizes MTJ stacks in conjunction with soft magnetic write lines. The magnetic write line(s) are preferably substantially or completely composed of a soft magnetic material. In addition, at least a core, as opposed to a cladding layer, includes the soft magnetic layer. The soft magnetic materials preferably include cobalt, nickel, iron, and/or alloys thereof. Due to the small spacing between the magnetic write line and the free layer of the MTJ stack, the magnetic vector of free layer is strongly coupled magnetostatically to the magnetic vector of the magnetic write line. Such a magnetostatic coupling promotes rotation amplitude for the free layer magnetic vector. Hence, write efficiency is improved.

Although the MRAM architecture described in the above-identified co-pending application functions well for its intended purpose, one of ordinary skill in the art will readily recognize that it would be highly desirable for the magnetic storage cells to have a closed magnetic flux. For MTJ stacks, it would be desirable for at least the free layer to have a closed flux in order to improve the ability of the MRAM architecture to be used at higher densities and smaller lateral dimensions of the MTJ stacks. For example, it would be desirable to have reduced magnetostatic interactions between magnetic layers within a magnetic storage cell and between magnetic storage cells. It would also be desirable for the MRAM architecture to have improved immunity against stray magnetic fields.

Accordingly it is highly desirable to provide an MRAM architecture that utilizes magnetic write lines for improved writing efficiency but has fewer magnetic interactions between magnetic layers, fewer magnetic interactions between memory cells, better protection against stray fields, and is thus better tailed for higher memory densities and smaller lateral dimensions of the MTJ stacks.

The present invention provides a method and system for providing and using a magnetic memory. The method and system comprise providing a plurality of magnetic memory cells and providing at least one magnetic write line coupled with the plurality of magnetic memory cells. Each of the plurality of magnetic memory cells includes a magnetic element having a data storage layer that stores data magnetically. The at least one magnetic write line is magnetostatically coupled with at least the data storage layer of the magnetic element of each of the plurality of magnetic memory cells. Consequently, flux closure is substantially achieved between the data storage layer of each of the plurality of magnetic memory cells.

The present invention will be described in terms of particular types of magnetic memory cells, particular materials, and a particular configuration of elements. Instead, the present invention is more generally applicable to magnetic devices for which it is desirable to reduce magnetostatic stray field and improve magnetic stability. For example, one of ordinary skill in the art will readily recognize that this method and system will operate effectively for other magnetic memories, other magnetic memory cells, and other materials and configurations non inconsistent with the present invention. Furthermore, the present invention is described in the context of metal-oxide-semiconductor (MOS) devices, particular magnetic elements-magnetic tunneling junction (MTJ) devices-and MRAM architectures. However, one of ordinary skill in the art will readily recognize that the present invention is not limited to such devices and architectures. Instead, other suitable devices, for example such as bipolar junction transistor devices and spin-valve giant magnetoresistive memory elements, may be used with or without modification to the inventive memory architecture. Thus, the method and system in accordance with the present invention are more generally applicable to magnetic devices for which improved magnetic stability is desired. Moreover, the present invention is described in the context of certain biasing structures. However, one of ordinary skill in the art will readily recognize that additional and/or other biasing structures not inconsistent with the present invention, as well as combinations of the biasing structures described herein can be utilized. Furthermore, the present invention is described in the context of a magnetic write line. However, one of ordinary skill in the art will readily recognize that the method and system can be used in conjunction with a segmented magnetic write line. In such a segmented magnetic write line, a nonmagnetic global write line is coupled with magnetic write line segments. Each magnetic write line segment is coupled with a portion of the magnetic memory cells for which the global write line is used. The present invention is also described in the context of providing a flux closure. However, one of ordinary skill in the art will readily recognize that the flux closure may not be complete. In particular, as used herein, a flux closure is one in which the effects of magnetic poles may be substantially reduced, but not necessarily completely eliminated.

Figure 2:
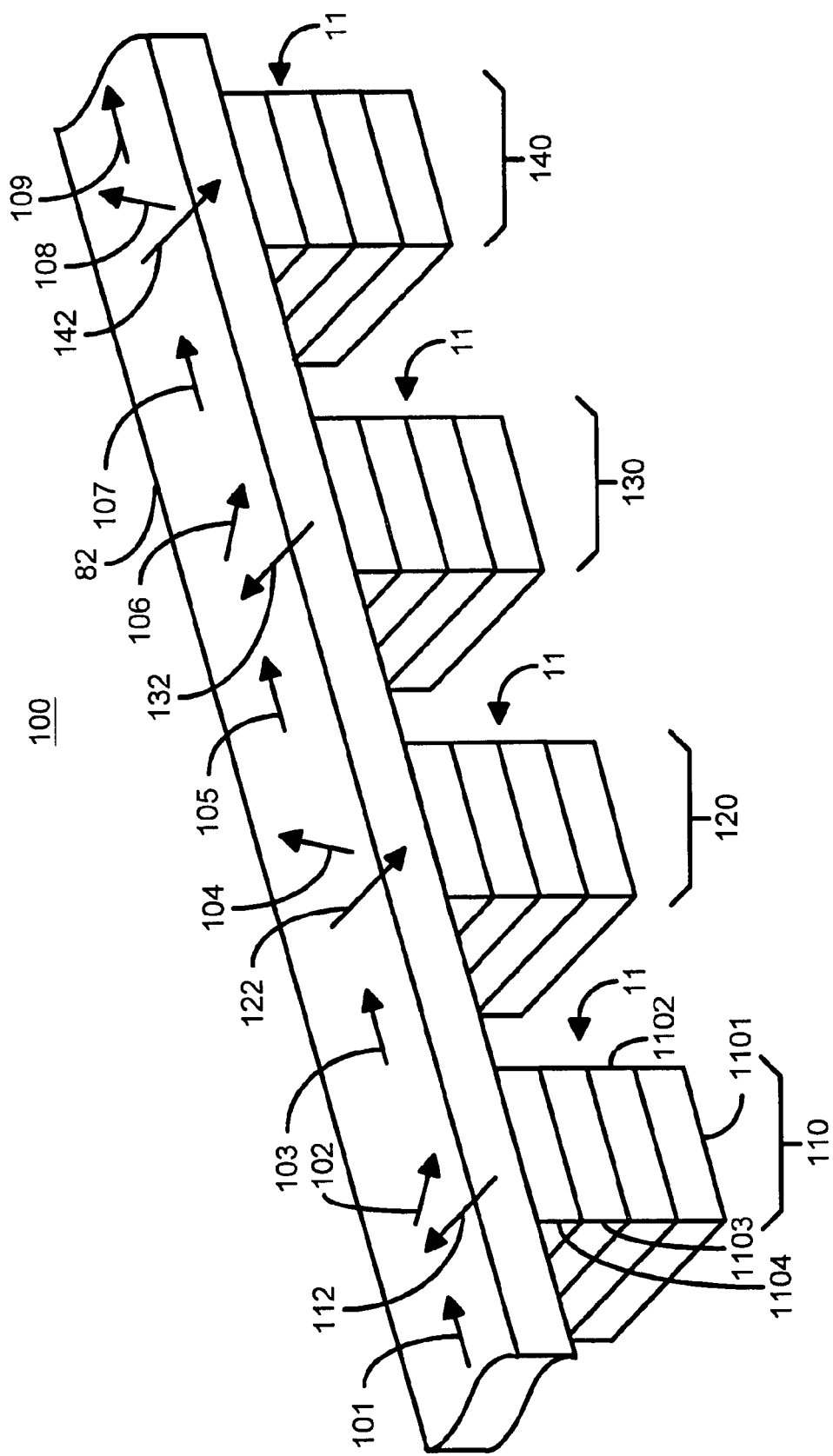
FIG. 2 depicts one embodiment of an architecture in accordance with the present invention including MTJ MRAM cells and a magnetic write line and having a closed flux data storage layer.

FIG. 2 depicts a one embodiment of an MRAM architecture 100 in accordance with the present invention including MTJ MRAM cells 110, 120, 130, and 140 a magnetic write line 82 and having a closed flux data storage layer. The magnetic write line 82 is preferably the magnetic write line described in the above-identified co-pending patent application. Although four MRAM cells 110, 120, 130, and 140 are depicted, there can be another number of MRAM cells (not shown) coupled with the magnetic write line 82, as well as other magnetic write lines (not shown) coupled with other MRAM cells (not shown).

The MRAM cells 110, 120, 130, and 140, each preferably utilize an MTJ stack 11 as a magnetic element. The MTJ stack 11 includes a pinned layer 1101 having the fixed magnetic vector, an insulating layer 1102, a free layer 1103 having with the changeable magnetic vector, and a capping layer 1104. The free layer 1103 is thus the data storage layer for the MTJ stack 11. The MTJ stack 11 also preferably includes additional layers (not shown) such as seed layer(s) and antiferromagnetic layer(s) that are exchange coupled the pinned layer 1101. Furthermore, each MRAM cell 110, 120, 130, and 140 preferably includes a CMOS selection transistor (not shown) and a write word line (not shown) analogous to those shown in FIG. 1, but are omitted for clarity and simplicity. In the MRAM architecture 100 in accordance with the present invention, the directions of the easy axes for the magnetic vectors of the MRAM cells 110, 120, 130, and 140 is oriented such that the magnetic vectors for at least the data storage layer of the MRAM cells 110, 120, 130, and 140 and the corresponding magnetic vectors for the magnetic write line form a flux closure. In a preferred embodiment, this means that the easy axes of the MRAM cells 110, 120, 130, and 140 are oriented substantially perpendicular to the lengthwise direction of the magnetic write line 82 and that the easy axis of the magnetic write line 82 is oriented in the lengthwise direction of the magnetic write line 82, as depicted in FIG. 2. However, nothing prevents other orientations that are not inconsistent with the present invention and that form the desired flux closures.

The magnetic write line 82 has a magnetization that is oriented substantially parallel to the lengthwise direction of the magnetic write line 82. However, on a microscopic scale, the magnetic vectors 101, 102, 103, 104, 105, 106, 107, 108, and 109 of the magnetic write line 82 vary depending upon the location in the magnetic write line. Away from the MRAM cells 110, 120, 130, and 140, the magnetic vectors 101, 103, 105, 107, and 109 are oriented in the lengthwise direction of the magnetic write line 82. However, the magnetic write line 82 is preferably strongly magnetostatically coupled to at the free layer 1104 of the MTJ stacks 11 in the MRAM cells 110, 120, 130, and 140. Thus, the direction of the magnetic vectors 102, 104, 106, and 108 varies depending upon the directions of the magnetic vectors 112, 122, 132, and 142 of the free layers 11 of the MRAM cells 110, 120, 130, and 140, respectively.

The easy axis of the free layer 1101 of the MTJ stacks 11 for the MRAM cells 110, 120, 130, and 140 is preferably substantially orthogonal to the easy axis of line 82. The thickness of capping layer 1104 is preferably much smaller than the lateral dimensions of the MTJ stack 11. Due to the small spacing between the magnetic write line 82 and the free layer 1103, the magnetic vector of the free layer 1103 for each of the MRAM cells 110, 120, 130, and 140 is strongly coupled magnetostatically to the corresponding magnetic vector 102, 104, 106, and 108 of the magnetic write line 82. Consequently, the corresponding magnetic vector 102, 104, 106, and 108 of the magnetic write line 82 in the region overlapping the MTJ 11 for the MRAM cells 110, 120, 130, and 140, respectively, rotates to form a flux closure. Thus, the free layer 1103 for each of the MRAM cells 110, 120, 130, and 140 is a closed flux layer.

The capping layer 1104 for each MTJ stack 11 is chosen so that a significant exchange coupling between free layer 1103 and magnetic write line 82 is prevented. Consequently, the magnetic coupling between the free layer 1103 of each MRAM cell 110, 120, 130, and 140 and the magnetic write line 82 is preferably limited to magnetostatic coupling. The capping layer 1104 can be made from a wide variety of metals, semi-metals and semiconductor materials. If the capping layer 1104 is a material such as Ru, Cr or Cu, that are known to provide the oscillatory anti-ferromagnetic exchange coupling, then the capping layer 1104 is thick enough to prevent an exchange coupling between the free layer 1103 and the magnetic write line. The capping layer 1104 can also be formed from an insulating material. However, the resistance of the capping layer 1104 should be small compared to that of the tunnel barrier layer 1102. The capping layer 1104 can also be formed from a material which acts as a thermal diffusion barrier so that the MTJ has good thermal stability. The capping layer may be selected from the group consisting of Cu, Pd, Pt, Rh, Ti, Cr, Ru and Os, or could be a binary metallic material, for example selected from the group consisting of $Cu_{(1-x)}Ni_x$ and $Ni_{(1-x)}Cr_x$. The capping layer could also include materials such as TiN, $Al_2O_3$.

In a preferred embodiment, the MRAM cells 110, 120, 130, and 140 may be written to and read from using processes similar to those described in the above-identified co-pending patent application. To write to an MRAM cell, such as the MRAM cell 110, a write current is provided in the magnetic write line 82. A magnetic field is induced by the write line current, in conjunction with a second write current in a word line (not shown), rotates the magnetic vector 112 of the free layer 1103 for the MRAM cell 110 away from the easy axis of the MTJ stack 110 for the MRAM cell 110. Due to the strong magnetostatic coupling between the magnetic vector 112 of the free layer 1103 for the MRAM cell 110 and that of the magnetic write line 82, the corresponding magnetic vector 102 of the magnetic write line 82 also rotates. However, the corresponding magnetic vector 102 rotates in a direction opposite to the direction in which the magnetic vector 112 rotates. As a result, the flux closure state with the magnetic vector 112 of the free layer 1103 of the MTJ stack 11 for the MRAM cell 110 is maintained. This flux closure promotes rotation amplitude for the free layer magnetic vector 112. Hence, write efficiency is improved. With a further increase in the amplitude of the write line current, the magnetic vector 112 of the free layer 1103 of the MTJ stack eventually settles in the desired direction, completing the write process.

In the embodiment of the MRAM 100 depicted in FIG. 2, the magnetic vectors 112, 122, 132, and 142 for the free layer 1103 of adjacent MRAM cells 110, 120, 130, and 140 are in opposite directions. Stated differently, the magnetic vectors 112, 122, 132, and 142 happen to alternate direction. The magnetic vectors 102, 104, 106, and 108 in the magnetic write line 82 in the region directly above the MTJ stacks 11 for the MRAM cell 110, 120, 130, and 140, respectively, rotates away from the easy axis of the magnetic write line 82 in a direction opposite to that of the free layer magnetic vector 112, 122, 132, and 142, respectively. To simplify the discussion, we decompose the magnetic vector in the magnetic write line 82 into two components, $M_e$ along the easy axis direction and $M_h$ along the hard axis direction of line 82, even though the two components are dependent on each other. Similarly, the magnetic vector 112, 122, 132, and 142 of the MRAM cells 110, 120, 130, and 140, respectively, can be decomposed into components, $M_s$ and $M_h$, in the easy axis and hard axis, respectively, directions of the MRAM cells 110, 120, 130, and 140, respectively. Note, however, that the easy axis of the MRAM cells 110, 120, 130, and 140 is preferably substantially perpendicular to the easy axis of the magnetic write line 82. Similarly, the hard axis of the MRAM cells 110, 120, 130, and 140 is preferably substantially perpendicular to the hard axis of the magnetic write line 82.

Figure 3A:
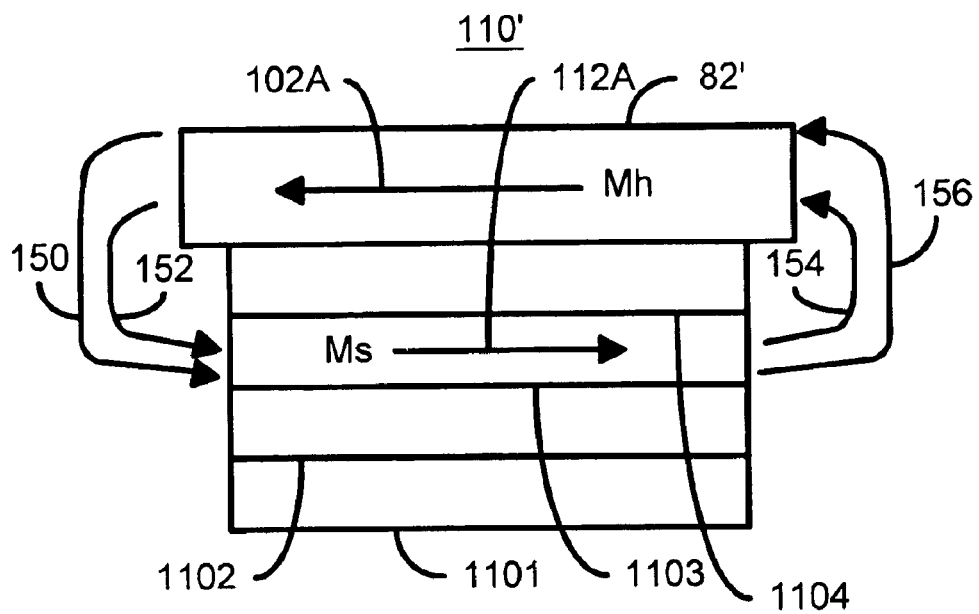
FIG. 3A depicts a cross-sectional view taken through an MTJ MRAM cell of the first embodiment of the magnetic memory in accordance with the present invention.
Figure 3B:
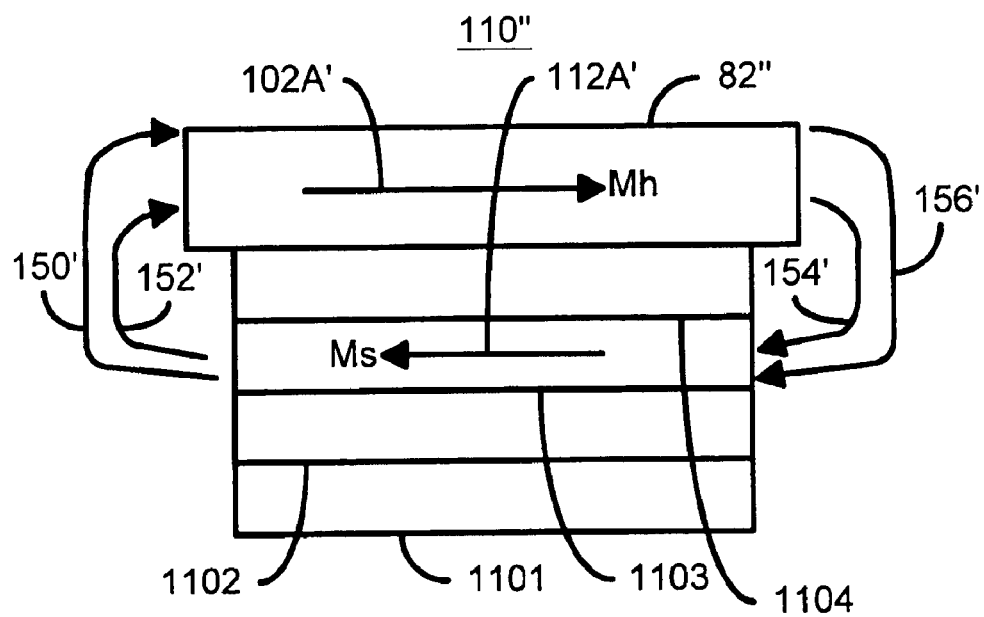
FIG. 3B depicts another cross-sectional view taken through the MRAM cell of the first embodiment of the magnetic memory in accordance with the present invention.

FIGS. 3A and 3B depict cross-sectional views taken through the MTJ of the MRAM cell 110 of the first embodiment of the MRAM 100 in accordance with the present invention. Thus, components of the MRAM cells 110' and 110" are analogous to the MRAM cell 110 depicted in FIG. 2 and are labeled similarly. Referring back to FIGS. 3A and 3B, the hard component, $M_h$ 102A, of the magnetic vector 102' of the magnetic write line 82' and the easy component, $M_s$ 112A, of the magnetic vector 112' of the MRAM cell 110'. FIG. 3A depicts the MRAM cell 110' when the magnetic vector 112' is in a first direction, while FIG. 3B depicts the MRAM cell 110' when the magnetic vector 112" is in the opposite direction.

Referring to FIGS. 3A and 3B, the vectors $M_h$ 102A and $M_h$ 102A' in line 82 in FIGS. 3A and 3B, respectively, only represent the hard component of the magnetic vector 102 (not shown) of the magnetic write line 82. Similarly, the vectors $M_s$ 112A and $M_s$ 112A' only represent the soft component of the magnetic vector 112 (not shown) of the free layer 1103. It can be understood by those of ordinary skill in the art that $M_h$ 102A and $M_s$ 112A produce magnetic dipoles (not explicitly shown) at the surfaces perpendicular to the magnetic vectors $M_h$ 102A and magnetic vectors $M_h$ 112A in FIG. 3A. Similarly, it can be understood by those of ordinary skill in the art that $M_h$ 102A' and $M_s$ 112A' produce magnetic dipoles (not explicitly shown) at the surfaces perpendicular to the magnetic vectors 102A' and magnetic vectors 112A' in FIG. 3B. The magnetic fields, shown by arrows 150, 152, 154 and 156 associated with the dipoles act on both $M_h$ 102A and $M_s$ 112A. Similarly, magnetic fields shown by arrows 150', 152', 154', and 156' associated with the dipoles act on both $M_h$ 102A' and $M_s$ 112A'. The interaction energy between free layer 1103 and line 82 takes a value given by $$E_i \propto -H_{df} M_h t_w S_f \propto -H_{dw} M_s t_f S_f$$

where $H_{df}$ is the coupling filed produced by free layer 1103 on the magnetic write line 82 and is proportional to the saturation magnetization, $M_s$, of the free layer, $t_w$, the thickness of the magnetic write line 82, $H_{dw}$ the coupling field produced by $M_h$ on free layer 1103 and is proportional to $M_h$, $t_f$ the thickness of free layer 1103, and S the surface area of the MTJ stack 11. Assuming the maximum value of $M_h$ is equal to $M_s$, which is achieved when $M_e$ is equal to zero, and the interaction area on both free layer 1103 and line 82 is the same and equal to the surface area of the MTJ stack 11, $S_f$, one can readily understand that $t_w$, the thickness of line 82' should be no less than the free layer thickness $t_f$ in order to achieve optimum flux closure.

The magnetostatic energy in a system can be expressed as the integral over all space of the magnetic field $$E = \int (H^2/8\pi) dv.$$

For the case that the magnetic write line 82' or 82" is not magnetic, the H field is produced by the magnetic charges on the end surface of the free layer 1103. When the magnetic write line 82' or 82" is made of magnetic material and coupled to the free layer 1103, the field produced by $M_h$ 102A and $M_h$ 102A', respectively, of the magnetic write line 82' or 82", respectively, cancels part of the field produced by free layer 1103. Consequently, the overall energy of the MRAM cell 110' and 110" is reduced and the MRAM cell 110' and 110" are made more stable. The magnetic field due to the dipoles on the magnetic write line 82 and the free layer 1103 can be cancelled to a greater degree, and, therefore, better stability can be achieved when the distance between the free layer 1103 and the magnetic write line 82' or 82" is reduced and ferromagnetic exchange coupling between the free layer 1103 and the magnetic write line 82' or 82" does not occur.

In addition to magnetostatic energy terms discussed above, exchange energy and anisotropy energy also exist in the MRAM 100 depicted in FIG. 2. The exchange energy between two adjacent atoms is given by $E_{ex} = -2JS \cos(\phi_{ij})$, where J is the exchange integral, S is the total spin quantum number of each atoms, and $\phi_{ij}$ is the angle between the magnetic vector of the two atoms. The direction of the magnetic vector of adjacent atoms should not change abruptly in order to minimize the energy of a magnetic system. The anisotropy energy takes the form $E_a = K_u \sin^2 \phi$, where $K_u$ is the magnetic anisotropy constant and $\phi$ is the angle between the magnetic vector and the easy axis of the magnetic anisotropy. For the magnetic write line 82 having an easy axis in the lengthwise direction, the anisotropy energy reaches its maximum when $M_h$ reaches maximum and $M_e$ reduces to zero. To reduce the anisotropy energy, $K_u$ should be small and the overall magnetic vector should be in the direction along the long axis of the magnetic write line 82.

The total magnetic energy in the MRAM 100 shown in FIG. 2 thus includes magnetostatic energy, exchange energy and anisotropy energy of the MRAM cells 110, 120, 130, and 140, as well as those not shown. The magnetostatic energy is the dominant energy in a magnetic system made of soft magnetic materials. The magnetic vectors 101, 102, 103, 104, 105, 106, 107, 108, 109, 112, 122, 132, and 142 are oriented to minimize magnetostatic energy by reducing magnetic dipoles wherever possible.

Figure 4A:
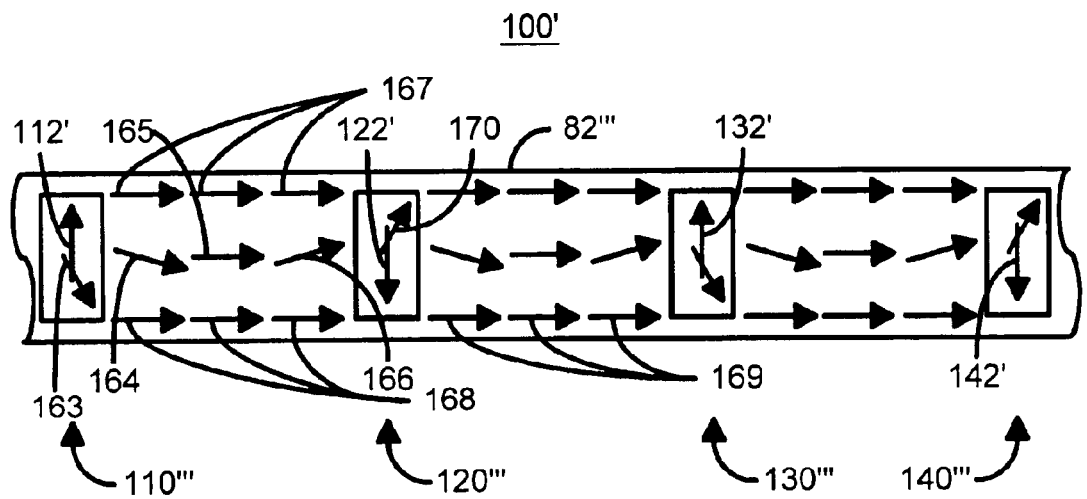
FIG. 4A depicts one embodiment of a possible distribution of the direction of the magnetic vectors in different regions of the magnetic write line when the free layer magnetic vectors of adjacent MTJ stacks are in different directions.

FIG. 4A depicts one embodiment the MRAM 100' with one possible distribution of the directions of the magnetic vectors in different regions of the magnetic write line 82'" when the free layer magnetic vectors 112', 122', 132', and 142' of adjacent MTJ stacks 11 are in a different direction.

The MRAM 100' has components corresponding to those in the MRAM 100 depicted in FIG. 2, which are labeled similarly. Referring back to FIG. 4A, the probable orientations of magnetic vectors in the magnetic write line 82'". For clarity, only magnetic vectors 163, 164, 165, 166, 167, 168, 169, and 170 in the magnetic write line 82'" are discussed. The magnetic vectors 112', 122', 132', and 142' for the free layers 1103 of the MRAM cells 110'", 120'", 130'", and 140'" are also depicted. The operation of the MRAM 100', is described in conjunction with the MRAM cell 110'". The magnetic vectors 163 and 170 rotate away from the easy axis direction to form a magnetic flux closure with magnetic vectors 112' and 122' in the free layer 1103 of each cell 110'" and 120'", respectively. As discussed previously, such a flux closure reduces the magnetostatic energy of the system formed by vectors 112' and 163. The magnetic vectors 167, 168, and 169 near the edges of the magnetic write line 82'" are oriented substantially along the edges of the magnetic write line 82'" to minimize the magnetostatic energy associated with the edges. The magnetic vectors 164 and 166 are oriented in a direction away from the easy axis so the direction transition from 163 to 164 will not introduce significant amount of magnetic charges in the magnetic write line 82'". There is an anisotropy energy increase associated with vectors 163 and 164. To reduce the anisotropy energy, the magnetic line 82'" should be made with $K_u$, the anisotropy constant, as close to zero as possible.

Figure 4B:
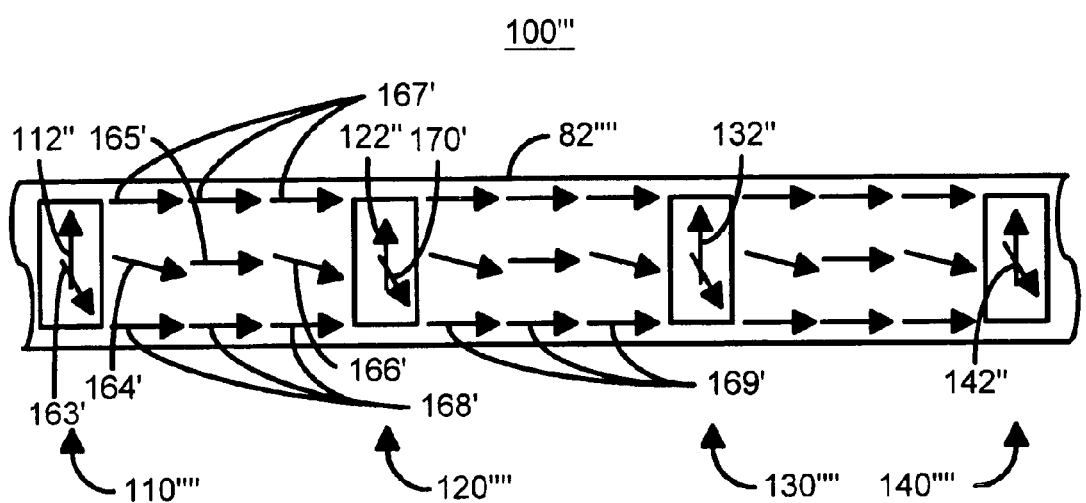
FIG. 4B depicts one embodiment of a possible distribution of the directions of the magnetic vectors in different regions of the magnetic write line when the free layer magnetic vectors of adjacent MTJ stacks are in the same direction.

FIG. 4B depicts another embodiment of the MRAM 100" of a possible distribution of the direction of the magnetic vectors in different regions of the magnetic write line 82"" when the free layer magnetic vectors 112", 122", 132", and 142" of adjacent MTJ stacks 11 are in the same direction. The magnetic vectors 112", 122", 132", and 142" in the free layers 1103 of the MTJ stacks 11 are all oriented in the same direction, upward in FIG. 4B. This is different from the MRAM 100' depicted in FIG. 4A where the magnetic vectors of adjacent cells are in different direction. Referring back to FIG. 4B, for clarity only the orientations of magnetic vectors 163', 164', 165', 166', 167', 168', 169', and 170' in the magnetic write line 82"" are shown. The magnetic vectors 112", 122", 132", and 142" for the free layers 1103 of the MRAM cells 110"", 120"", 130"", and 140"" are also depicted. The MRAM 100" operates in an analogous manner to the MRAM 100'. Thus, the magnetic vectors 163', and 170' rotate away from the easy axis direction to form a magnetic flux closure with magnetic vectors 112" and 122" in the free layers 1103 of the MRAM cells 110"" and 120"", respectively. The vector 166', which represents the magnetic vector in the magnetic write line 82"" in the region near the left edge of the MTJ stacks 11, orient differently from vector 166' in FIG. 4A to suppress the magnetostatic energy due to the change in orientation of the magnetic vector 122".

Thus, the MRAMs 100, 100', and 100" have magnetostatic coupling between the magnetic write line 82, 82'", and 82"", respectively and the free layers 1103 of the corresponding MRAM cells. Consequently, a flux closure is formed for each of the free layers 1103 in the MRAMs 100, 100', and 100". Thus, the MRAMs 100, 100', and 100" have fewer magnetic interactions between magnetic layers 1101 and 1103, fewer magnetic interactions between memory cells 110, 120, 130, and 140; 110'", 120'", 130'", and 140'"; and 110"", 120"", 130"", and 140"", and better protection against stray fields. The MRAMs 100, 100', and 100" are thus better tailed for higher memory densities and smaller lateral dimensions of the MTJ stacks 11.

Figure 5:
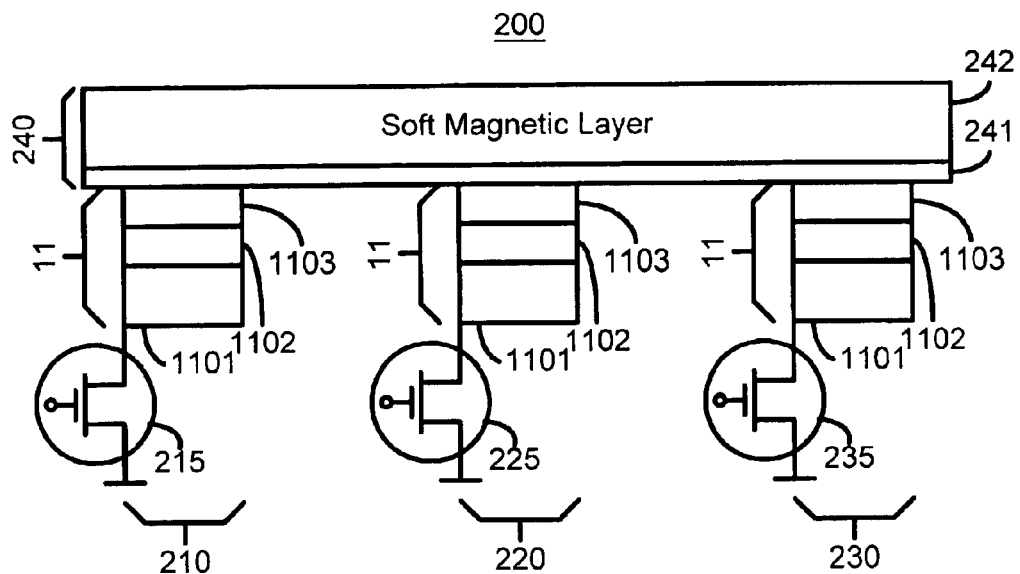
FIG. 5 depicts a second embodiment of an architecture in accordance with the present invention including a MTJ MRAM cell and a magnetic write line and having a closed flux data storage layer.

FIG. 5 depicts a second embodiment of an architecture 200 in accordance with the present invention having a closed flux data storage layer. The MRAM 200 includes MRAM cells 210, 220, and 230 and a magnetic write line 240, which corresponds to the magnetic write lines 82, 82', 82", 82'", and 82"". Each MRAM cell 210, 220, and 230 includes an MTJ stack 11 as a magnetic element and a selection device 215, 225, and 235, respectively, that is preferably a transistor. The MTJ stack includes at least the pinned layer 1101, barrier layer 1102, and free layer 1103. In addition, underlying layers (not shown) that may include seed and antiferromagnetic layers can be provided. However, there is no capping layer on the MTJ stacks 11 to act as a spacer layer between the free layer 1103 and the magnetic write line 240 and prevent exchange coupling. Instead, the magnetic write line 242 includes a soft magnetic layer 242 and a nonmagnetic layer 241. In addition, the nonmagnetic layer 241 is a high conductivity layer that is preferably in contact with the MTJ stacks 11. The soft magnetic layer 242, which is part of the magnetic write line 240, is coupled magnetostatically with the free layers 1103 of the MTJ stacks across the nonmagnetic layer 241. The magnetic vectors in the soft magnetic layer 242 and the magnetic vectors of the free layers 1103 of the MTJ stacks 11 are oriented such that a flux closure is formed. Similar materials to the candidates described for the capping 1104 may be used for the nonmagnetic layer 241. Moreover, the nonmagnetic layer 241 should be much thinner than the lateral dimensions of MTJ 11 in order to promote good coupling between the magnetic write line 240 and the free layers 1103. However, an exchange coupling between the free layers 1103 and the soft magnetic layer 242 of the magnetic write line 240 is not desired. Thus, the MRAM 200 shares the benefits of the MRAMs 100, 100', and 100". In addition, the magnetic write line 240 includes the nonmagnetic layer 241 that servers many of the purposes of the capping layer 1104 of the MTJ stacks 11.

Figure 6:
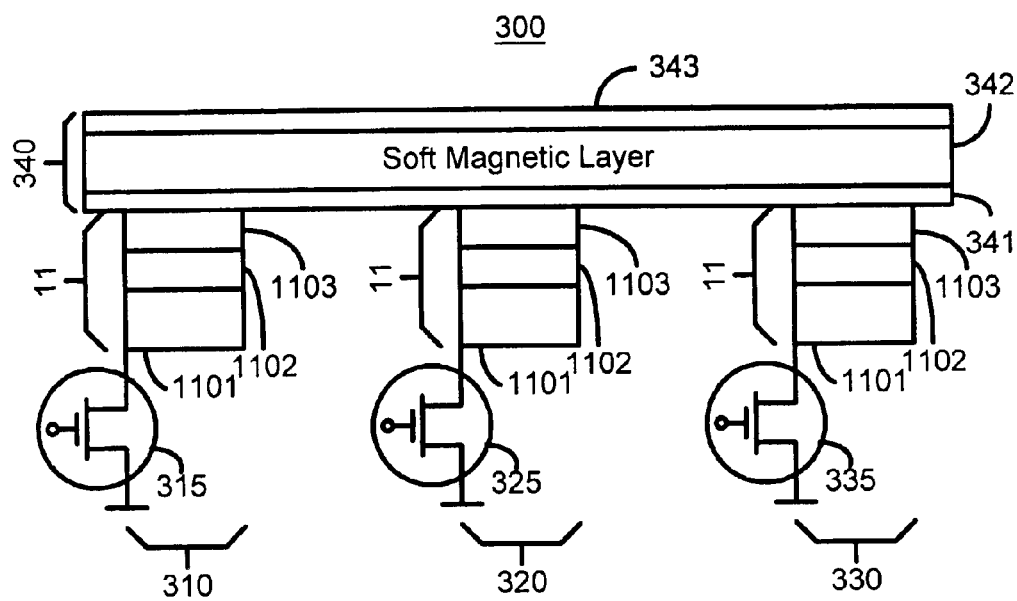
FIG. 6 is a third embodiment of an architecture in accordance with the present invention including a MTJ MRAM cell and a magnetic write line and having a closed flux data storage layer.

FIG. 6 depicts a third embodiment of an architecture 300 in accordance with the present invention having a closed flux data storage layer. The MRAM 300 includes MRAM cells 310, 320, and 330 and a magnetic write line 340, which corresponds to the magnetic write line 240 depicted in FIG. 5. Referring back to FIG. 6, each MRAM cell 310, 320, and 330 includes an MTJ stack 11 as a memory element and a selection device 315, 325, and 335, respectively, that is preferably a transistor. The MTJ stack includes at least the pinned layer 1101, barrier layer 1102, and free layer 1103. In addition, underlying layers (not shown) that may include seed and antiferromagnetic layers can be provided. However, there is no capping layer on the MTJ stacks 11 to act as a spacer layer between the free layer 1103 and the magnetic write line 340 and prevent exchange coupling. Instead, the magnetic write line 340 includes three layers: a high conductive spacer layer 341, a soft magnetic layer 342, and another conductive layer 343. The conductive spacer layer 341 and soft magnetic layer 342 are analogous to the layers 231 and 242, respectively, depicted in FIG. 5. Referring back to FIG. 6, the soft magnetic layer 342, which is part of the magnetic write line 340, is coupled magnetostatically with the free layers 1103 of the MTJ stacks across the nonmagnetic layer 341. The magnetic vectors in the soft magnetic layer 342 and the magnetic vectors of the free layers 1103 of the MTJ stacks 111 are oriented such that a flux closure is formed. The additional conductive layer 343 is designed in the magnetic write line 340 to adjust the resistivity of the magnetic write line 340. As a result, a particular desired resistance of the magnetic write line 340 may be achieved. Thus, in addition to the benefits of the MRAMs 100, 100', 100", and 200, the MRAM 300 also allows for the resistance of the magnetic write line 340 to be tailored.

Figure 7:
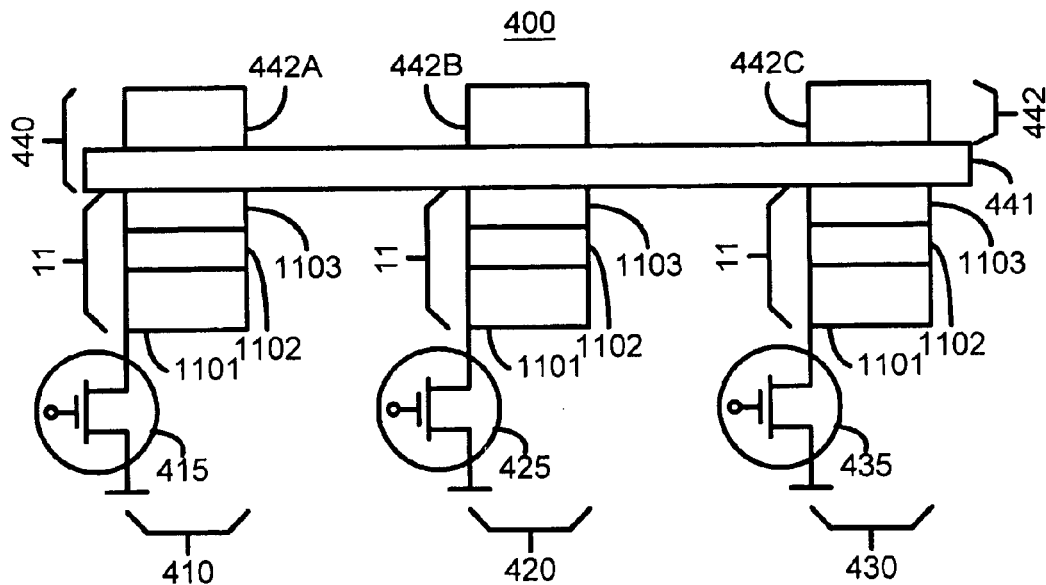
FIG. 7 is a fourth embodiment of an architecture in accordance with the present invention including a MTJ MRAM cell and a magnetic write line and having a closed flux data storage layer.

FIG. 7 is a fourth embodiment of an architecture 400 in accordance with the present invention having a closed flux data storage layer. The MRAM 400 includes MRAM cells 410, 420, and 430. Each MRAM cell 410, 420, and 430 includes an MTJ stack 11 as a memory element and a selection device 415, 425, and 435, respectively, that is preferably a transistor. The MRAM 400 includes magnetic write line 440. The magnetic write line 440 is analogous to the magnetic write line 240 and thus includes a nonmagnetic layer 441 and a soft magnetic layer 442. However, the soft magnetic layer has been patterned to regions 442A, 442B, and 442C, which only overlap the MTJ stacks 11 of the MRAM cells 410, 420, and 430. The magnetic moment of each of the soft magnetic portion 442A, 442B, and 442C and the free layers 1103 is preferred to be the same. In other words, the saturation magnetization multiplied by the thickness should be the same for each of the two films 442 and the free layer 1103. The shape as well as the easy axis direction of the regions 442A, 442B, and 442C is also preferred to be the same as that of the free layer 1103. The magnetic flux closure between the free layers 1103 of the MRAM cells 410, 420, and 430 and soft magnetic regions 442A, 442B, and 442C occurs across the nonmagnetic layer 441. Therefore, the material property and thickness of the layer 441 should be designed in a similar manner to the layer 1104 depicted in FIG. 2.

Figure 8:
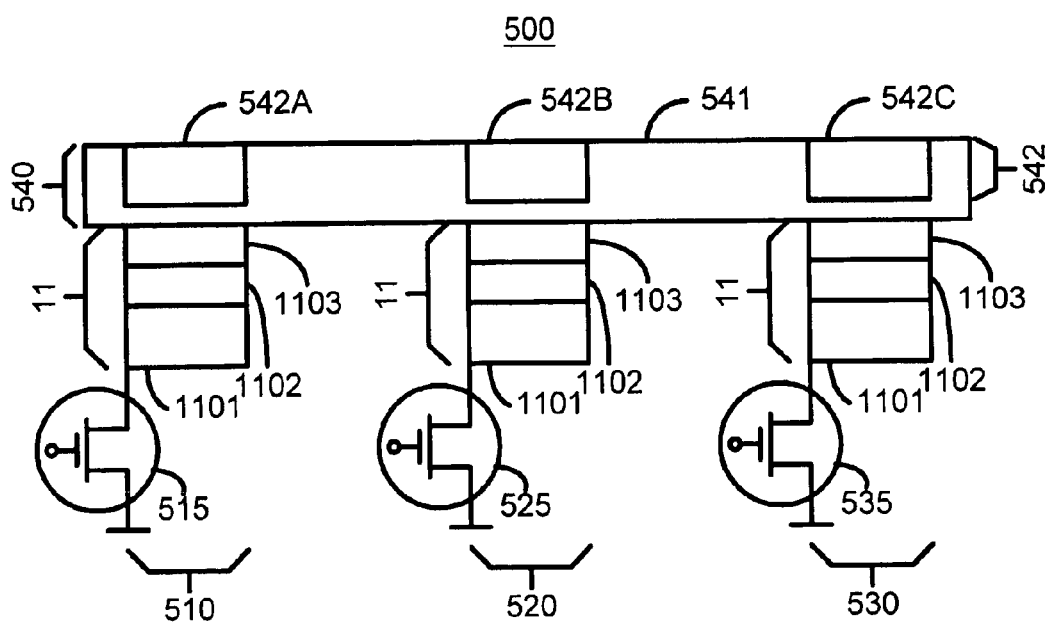
FIG. 8 is a fifth embodiment of an architecture in accordance with the present invention including a MTJ MRAM cell and a magnetic write line and having a closed flux data storage layer.

FIG. 8 depicts a fifth embodiment of an architecture 500 in accordance with the present invention having a closed flux data storage layer. The MRAM 500 includes MRAM cells 510, 520, and 530. Each MRAM cell 510, 520, and 530 includes an MTJ stack 11 as a memory element. Each MTJ stack 11 has at least a pinned layer 1101, an insulator layer 1102, and a free layer 1103. The MRAM 500 is analogous to the MRAM 400 depicted in FIG. 7. Thus, the soft magnetic write line 540 includes a nonmagnetic layer 541 and soft magnetic regions 542A, 542B, and 542C. The soft magnetic regions 542A, 542B, and 542C correspond to the regions 442A, 442B, and 442C depicted in FIG. 7. However, referring to FIGS. 7 and 8, the soft magnetic regions 542A, 542B, and 542C are sunk into the nonmagnetic line 541. Similar to the MRAM 400, the magnetic moments of regions 542A, 542B, and 542C and the free layers 1103 of the MRAM cells 510, 520, and 530 are preferred to be the same. The shape as well as the easy axis direction of the regions 542A, 542B, and 542C are also preferred to be the same as that of the free layers 1103 of the MRAM cells 510, 520, and 530, respectively. Thus, the regions 542A, 542B, and 542C and the free layers 1103 of the MRAM cells 510, 520, and 530 form a flux closure. In addition, the configuration of the layers 541 and regions 542A, 542B, and 542C of the magnetic write line 540 allow the resistance of the magnetic write line 540 to a preferred value.

Figure 9:
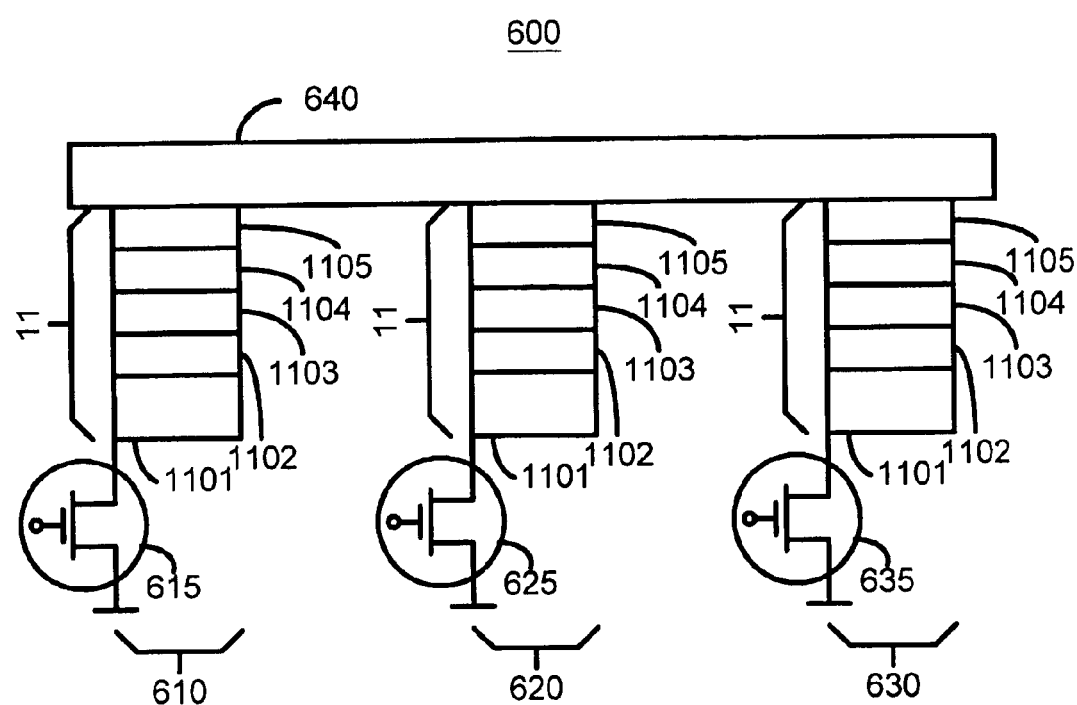
FIG. 9 is a sixth embodiment of an architecture in accordance with the present invention including a MTJ MRAM cell and a magnetic write line and having a closed flux data storage layer.

FIG. 9 depicts a sixth embodiment of an architecture 600 in accordance with the present invention having a closed flux data storage layer. The MRAM 600 includes MRAM cells 610, 620, and 630 and a magnetic write line 640, which corresponds to the magnetic write lines 82, 82', 82", 82''', and 82''''. Each MRAM cell 610, 620, and 630 includes an MTJ stack 11 as a memory element and a selection device 615, 625, and 635, respectively, that is preferably a transistor. The MTJ stack includes at least the pinned layer 1101, barrier layer 1102, and free layer 1103. In addition, underlying layers (not shown) that may include seed and antiferromagnetic layers can be provided. Furthermore, a nonmagnetic capping layer 1104 is also provided. However, an additional layer 1105 is provided in each MTJ stack 11 for each MRAM cell 610, 620, and 630. The additional layer 1105 is a soft magnetic layer that is inserted between spacer layer 1104 and the magnetic write line 640. The magnetic vector of the soft magnetic layer 1105 is exchange coupled to the magnetic vector of the magnetic write line 640 and oriented in the same direction. The magnetic vectors of the magnetic write line 640 and the magnetic layers in the MRAM cells 610, 620, and 630 form a flux closure. In addition, because of the use of the soft magnetic layers 1105, the MTJ stacks 11 for the MRAM cells 610, 520, and 630 may be patterned after layer 1105 is deposited. As a consequence, the thickness and integrity of the spacer layer 1104 can be better controlled.

A method and system has been disclosed for providing a magnetic memory having improved writing efficiency, better reliability, simpler fabrication, and improved magnetic stability. The magnetic memory also has fewer magnetic interactions between magnetic layers, fewer magnetic interactions between memory cells, better protection against stray fields, and is thus better tailed for higher memory densities and smaller lateral dimensions of the magnetic memory elements. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:
    a plurality of magnetic memory cells, each of the plurality of magnetic memory cells including a magnetic element having a data storage layer that stores data magnetically;
    at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, each of the at least one magnetic write line having a core portion including a magnetic material.

2. The magnetic memory of claim 1 wherein the magnetic element is a magnetic tunneling junction including a pinned layer, a free layer and an insulating layer between the pinned layer and the free layer, the free layer being the data storage layer.

3. A magnetic memory comprising:
    a plurality of magnetic memory cells, each of the plurality of magnetic memory cells including a magnetic element having a data storage layer that stores data magnetically, the magnetic element being a magnetic tunneling junction including a Dinned layer, a free layer and an insulating layer between the pinned layer and the free layer, the free layer being the data storage layer;
    at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells;
    wherein the magnetic tunneling junction further includes a capping layer between the free layer and the at least one magnetic write line, the capping layer being configured to preclude an exchange coupling between the free layer and the at least one magnetic write line.

4. The magnetic memory of claim 3 wherein the magnetic tunneling junction further includes a soft magnetic layer disposed between the capping layer and the at least one magnetic write line.

5. A magnetic memory comprising:
a plurality of magnetic memory cells, each of the plurality of magnetic memory cells including a magnetic element having a data storage layer that stores data magnetically, the magnetic element being a magnetic tunneling junction including a pinned layer, a free layer and an insulating layer between the pinned layer and the free layer, the free layer being the data storage layer;
at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells;
wherein the magnetic tunneling junction further includes at least one additional layer including an antiferromagnetic layer, the antiferromagnetic layer being magnetically coupled to the pinned layer.

6. The magnetic memory of claim 1 wherein the data storage layer has a first easy axis and the at least one magnetic write line has a second easy axis, the first easy axis being substantially perpendicular to the second easy axis.

7. The magnetic memory of claim 1 wherein the at least one magnetic write line includes a nonmagnetic layer and a soft magnetic layer, the nonmagnetic layer residing between the soft magnetic layer and the magnetic element of each of the plurality of magnetic storage cells.

8. A magnetic memory comprising:
a plurality of magnetic memory cells, each of the plurality of magnetic memory cells including a magnetic element having a data storage layer that stores data magnetically;
at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, the at least one magnetic write line including a nonmagnetic layer and a soft magnetic layer, the nonmagnetic layer residing between the soft magnetic layer and the magnetic element of each of the plurality of magnetic storage cells;
wherein the at least one magnetic write line further includes a conductive layer, the soft magnetic layer residing between the conductive layer and the nonmagnetic layer.

9. The magnetic memory of claim 8 wherein the conductive layer is configured to ensure that the at least one magnetic write line has a desired resistance.

10. A magnetic memory comprising:
a plurality of magnetic memory cells, each of the plurality of magnetic memory cells including a magnetic element having a data storage layer that stores data magnetically;
at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells;
wherein the at least one magnetic write line includes a nonmagnetic layer and a plurality of soft magnetic structures, the plurality of soft magnetic structures being disposed directly above the plurality of magnetic memory cells, the nonmagnetic layer being disposed between the plurality of soft magnetic structures and the plurality of magnetic memory cells.

11. The magnetic memory of claim 10 wherein the nonmagnetic layer includes a plurality of recesses therein, at least a portion of each of the plurality of soft magnetic structures residing in each of the plurality of recesses.

12. A method for utilizing a magnetic memory comprising the steps of:
(a) in a write mode, writing to a first portion of a plurality of magnetic memory cells, each, of the plurality of magnetic memory cells including a magnetic element having a data storage layer that stores data magnetically, the plurality of magnetic memory cells being coupled with at least one magnetic write line, the at least one magnetic write line being magnetostatically coupled with at least the data storage layer of the magnetic element of each of the plurality of magnetic memory cells such that flux closure is substantially achieved for the data storage layer of each of the plurality of magnetic memory cells; and
(b) in a read mode, reading from a second portion of the plurality of magnetic memory cells.

13. A method for providing a magnetic memory comprising:
providing a plurality of magnetic memory cells, each of the plurality of magnetic memory cells including a magnetic element having a data storage layer that stores data magnetically;
providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, each of the at least one magnetic write line having a core portion including a magnetic material.

14. The method of claim 13 wherein the magnetic memory cell providing step further includes the step of:
providing a magnetic tunneling junction as the magnetic element, the magnetic tunneling junction including a pinned layer, a free layer and an insulating layer between the pinned layer and the free layer, the free layer being the data storage layer.

15. A method for providing a magnetic memory comprising:
providing a plurality of magnetic memory cells, each of the plurality of magnetic memory cells including a magnetic element having a data storage layer that stores data magnetically, the magnetic memory cell providing step further including:
providing a magnetic tunneling junction as the magnetic element, the magnetic tunneling junction including a pinned layer, a free layer and an insulating layer between the pinned layer and the free layer, the free layer being the data storage layer;

wherein the magnetic tunneling junction providing step further includes the step of:

providing a capping layer between the free layer and the at least one magnetic write line, the capping layer being configured to preclude an exchange coupling between the free layer and the at least one magnetic write line;

providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells.

16. The method of claim 15 wherein the magnetic tunneling junction providing step further includes the step of:

providing a soft magnetic layer disposed between the capping layer and the at least one magnetic write line.

17. A method for providing a magnetic memory comprising:

providing a plurality of magnetic memory cells, each of the plurality of magnetic memory cells including a magnetic element having a data storage layer that stores data magnetically, the magnetic memory cell providing step further including:

providing a magnetic tunneling junction as the magnetic element, the magnetic tunneling junction including a pinned layer, a free layer and an insulating layer between the pinned layer and the free layer, the free layer being the data storage layer;

wherein the magnetic tunneling junction,n providing step further includes the step of:

providing at least one additional layer including an antiferromagnetic layer, the antiferromagnetic layer being magnetically coupled to the pinned layer;

providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells.

18. The method of claim 13 wherein the data storage layer has a first easy axis and the at least one magnetic write line has a second easy axis, the first easy axis being substantially perpendicular to the second easy axis.

19. The method of claim 13 wherein the at least one magnetic write line providing step further includes the step of:

providing a nonmagnetic layer; and providing a soft magnetic layer, the nonmagnetic layer residing between the soft magnetic layer and the magnetic element of each of the plurality of magnetic storage cells.

20. A method for providing a magnetic memory comprising:

providing a plurality of magnetic memory cells, each of the plurality of magnetic memory cells including a magnetic element having a data storage layer that stores data magnetically;

providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, wherein the at least one magnetic write line providing step further includes the step of:

providing a nonmagnetic layer;

providing a soft magnetic layer, the nonmagnetic layer residing between the soft magnetic layer and the magnetic element of each of the plurality of magnetic storage cells; and providing a conductive layer, the soft magnetic layer residing between the conductive layer and the nonmagnetic layer.

21. The method of claim 20 wherein the conductive layer is configured to ensure that the at least one magnetic write line has a desired resistance.

22. A method for providing a magnetic memory conspiring:

providing a plurality of magnetic memory cells, each of the plurality of magnetic memory cells including a magnetic element having a data storage layer that stores data magnetically;

providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, wherein the step of providing the at least one magnetic write line further includes the step of:

providing a nonmagnetic layer; and providing a plurality of soft magnetic structures, the plurality of soft magnetic structures being disposed directly above the plurality of magnetic memory cells, the nonmagnetic layer being disposed between the plurality of soft magnetic structures and the plurality of magnetic memory cells.

23. The method of claim 22 wherein the nonmagnetic layer providing step further includes the step of:

providing a plurality of recesses in the nonmagnetic layer, at least a portion of each of the plurality of soft magnetic structures residing in each of the plurality of recesses.

24. A magnetic memory comprising:

a plurality of magnetic memory cells, each of the plurality of magnetic memory cells including a magnetic element having a data storage layer that stores data magnetically, a magnetic layer, and at least one nonmagnetic layer, the magnetic layer separated from the data storage layer by the at least one nonmagnetic layer;

at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, the magnetic layer of each of the plurality of magnetic memory cells being adjacent to at least one of the at least one magnetic write line.

25. A method for providing a magnetic memory comprising:
- providing a plurality of magnetic memory cells, each of the plurality of magnetic memory cells including a magnetic element having a data storage layer that stores data magnetically, a magnetic layer, and at least one nonmagnetic layer, the magnetic layer separated from the data storage layer by the at least one nonmagnetic layer;
- providing at least one magnetic write line coupled with the plurality of magnetic memory cells, the at least one magnetic write line being magnetostatically coupled with at least the data storage layer of the magnetic element of each of the plurality of magnetic memory cells such that flux closure is substantially achieved for the data storage layer of each of the plurality of magnetic memory cells, the magnetic layer of each of the plurality of magnetic memory cells being adjacent to at least one of the at least one magnetic write line.

* * * * *